United States Patent
Van Tran et al.

(10) Patent No.: US 7,728,563 B2
(45) Date of Patent: Jun. 1, 2010

(54) FAST VOLTAGE REGULATORS FOR CHARGE PUMPS

(75) Inventors: Hieu Van Tran, San Jose, CA (US); Sang Thanh Nguyen, Union City, CA (US); Anh Ly, San Jose, CA (US); Hung O. Nguyen, Fremont, CA (US); Wingfu Aaron Lau, San Jose, CA (US); Nasrin Jaffari, Santa Clara, CA (US); Thuan Trong Vu, San Jose, CA (US); Vishal Sarin, Cupertino, CA (US); Loc B. Hoang, San Jose, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 12/340,571

(22) Filed: Dec. 19, 2008

(65) Prior Publication Data

US 2009/0160411 A1     Jun. 25, 2009

Related U.S. Application Data

(60) Division of application No. 11/941,964, filed on Nov. 18, 2007, which is a continuation of application No. 11/080,070, filed on Mar. 14, 2005, now Pat. No. 7,362,084.

(51) Int. Cl.
*G05F 1/613* (2006.01)

(52) U.S. Cl. .................. 323/222; 323/225; 323/268

(58) Field of Classification Search .......... 323/222, 323/223–226, 268, 270–271
See application file for complete search history.

(56) References Cited

U.S. PATENT DOCUMENTS

| | | | |
|---|---|---|---|
| 4,665,356 A | 5/1987 | Pease | |
| 5,479,092 A | 12/1995 | Pigott et al. | |
| 5,493,207 A | 2/1996 | Beasom | |
| 5,563,779 A | 10/1996 | Cave et al. | |
| 5,754,078 A | 5/1998 | Tamagawa | |
| 5,796,296 A | 8/1998 | Krentz | |
| 5,798,637 A | 8/1998 | Kim et al. | |
| 5,815,446 A | 9/1998 | Tobita | |
| 5,986,936 A | 11/1999 | Ravazzini | |
| 6,009,022 A | 12/1999 | Lee et al. | |
| 6,034,519 A | 3/2000 | Yang | |
| 6,147,923 A | 11/2000 | Nakano | |

(Continued)

FOREIGN PATENT DOCUMENTS

WO    WO 03047100 A1    6/2003

*Primary Examiner*—Harry Behm
(74) *Attorney, Agent, or Firm*—DLA Piper LLP (US)

(57) ABSTRACT

A digital multilevel memory system includes a charge pump and a voltage regulator for generating regulated high voltages for various memory operations. The charge pump may include a plurality of boost circuits to boost the output of the charge pump during a fast start up. Afterwards, the boost circuits are disabled to allow the charge pump to generate high voltages without boosting. The boost circuits may be successively enabled to boost the voltage. The boost circuits may be loadless. The voltage regulator may operate in an open loop and may include a resistive divider as a reference voltage for regulating the high voltage from the charge pump. The charge pump may include spread spectrum pump clocking to reduce electromagnetic inference for capacitor or inductor on-chip charge pumping.

23 Claims, 9 Drawing Sheets

U.S. PATENT DOCUMENTS

| | | | |
|---|---|---|---|
| 6,150,872 | A | 11/2000 | McNeill et al. |
| 6,160,391 | A | 12/2000 | Banba |
| 6,198,330 | B1 * | 3/2001 | Hopkins ..................... 327/333 |
| 6,201,433 | B1 | 3/2001 | Nagatomo |
| 6,232,829 | B1 | 5/2001 | Dow |
| 6,249,445 | B1 | 6/2001 | Sugasawa |
| 6,259,612 | B1 | 7/2001 | Itoh |
| 6,282,145 | B1 | 8/2001 | Tran |
| 6,288,951 | B1 | 9/2001 | Chen et al. |
| 6,329,871 | B2 | 12/2001 | Taguchi |
| 6,411,069 | B1 | 6/2002 | Hollmer |
| 6,441,653 | B1 * | 8/2002 | Spurlin ..................... 327/108 |
| 6,480,421 | B2 | 11/2002 | Osama et al. |
| 6,504,736 | B1 | 1/2003 | Ono |
| 6,570,367 | B2 | 5/2003 | Bartenschlager et al. |
| 6,734,655 | B1 * | 5/2004 | Javanifard et al. ........... 323/222 |
| 6,734,718 | B1 | 5/2004 | Pan |
| 6,788,608 | B2 | 9/2004 | Tran et al. |
| 6,836,178 | B2 | 12/2004 | Kim |
| 6,873,143 | B2 | 3/2005 | Moon et al. |
| 6,958,594 | B2 | 10/2005 | Redl et al. |
| 7,015,684 | B2 | 3/2006 | Chen |
| 7,023,186 | B2 * | 4/2006 | Yan ............................ 323/225 |
| 7,053,596 | B2 * | 5/2006 | Koyasu ..................... 323/313 |
| 7,064,601 | B2 | 6/2006 | Kwak et al. |
| 7,071,748 | B2 | 7/2006 | Wich |
| 7,180,794 | B2 | 2/2007 | Matsue |
| 7,268,611 | B2 | 9/2007 | Kikuchi et al. |
| 2003/0122611 | A1 | 7/2003 | Min |
| 2003/0160649 | A1 | 8/2003 | Nakai |
| 2003/0197551 | A1 | 10/2003 | Hamamoto et al. |
| 2005/0024126 | A1 | 2/2005 | Suwa et al. |

* cited by examiner

US 7,728,563 B2

FAST VOLTAGE REGULATORS FOR CHARGE PUMPS

CROSS-REFERENCE TO RELATED APPLICATIONS

This is a division of application Ser. No. 11/941,964, filed Nov. 18, 2007, published as US2008/0111532A1, which is continuation of application Ser. No. 11/080,070, filed Mar. 14, 2005, published as US2006/0202668A1, now U.S. Pat. No. 7,362,084, and is related to application Ser. No. 11/080,067, filed Mar. 14, 2005, now publication No. US2006/0202741A1, all of which are incorporated herein by reference in entirety.

BACKGROUND

1. Field

The present invention relates to a charge pump and voltage regulator system, and more particularly to a charge pump and voltage regulator system for multilevel memory cell systems.

2. Description of Related Information

A conventional mixed mode integrated circuit system frequently uses different voltage supplies. Analog signal processing, such as amplification, comparison, and pulse generation, may be performed at high voltage. A flash memory applies an erase signal, a programming signal, and a read signal to memory cells. The erase signal, the programming signal, and the read signal have voltage levels greater than a supply voltage. Also in multilevel volatile memories, the variation of the voltage level of the signal falls in a smaller range for the multibit signals stored in the memory cells. A charge pump and a voltage regulator may be used to generate the erase signal, the programming signal, and the read signal.

SUMMARY

A charge pump system comprises a charge pump and a plurality of boost circuits. The charge pump includes an output for providing a stable voltage signal. The plurality of boost circuits selectively boost voltage on the output terminal of the charge pump during a first mode. The charge pump provides a voltage on the output terminal in a second mode.

In another aspect, the charge pump system may include a charge pump and a spread spectrum pumping clock. In yet another aspect, the charge pump system may include a charge pump and a dithering pumping clock.

A voltage regulator comprises a reference circuit and a current mirror. The reference circuit generates a reference current in response to a supply voltage. The current mirror is coupled to a high voltage terminal and to the reference circuit. The current mirror generates a mirror current in response to the reference circuit and is arranged to provide a second voltage proportional to a first voltage across a portion of the reference circuit.

DETAILED DESCRIPTION

A digital multilevel bit memory array system includes a charge pump that includes multiple loadless successive lifted pumps and includes an open loop series fast voltage regulator that can be used to pump the word-line voltage during memory operations, such as read. The pump circuit provides faster operation due to multiple ratio-ed loadless successive fast boosting. The charge pump may include a capacitor charge pump and/or on-chip inductor charge pump. The voltage regulator provides fast and accurate biasing using a resistor divider MOS reference with an open loop series topology. The system may include a spread spectrum charge pump to reduce electromagnetic interference for a capacitor or inductor on-chip charge pump.

Figure 1:
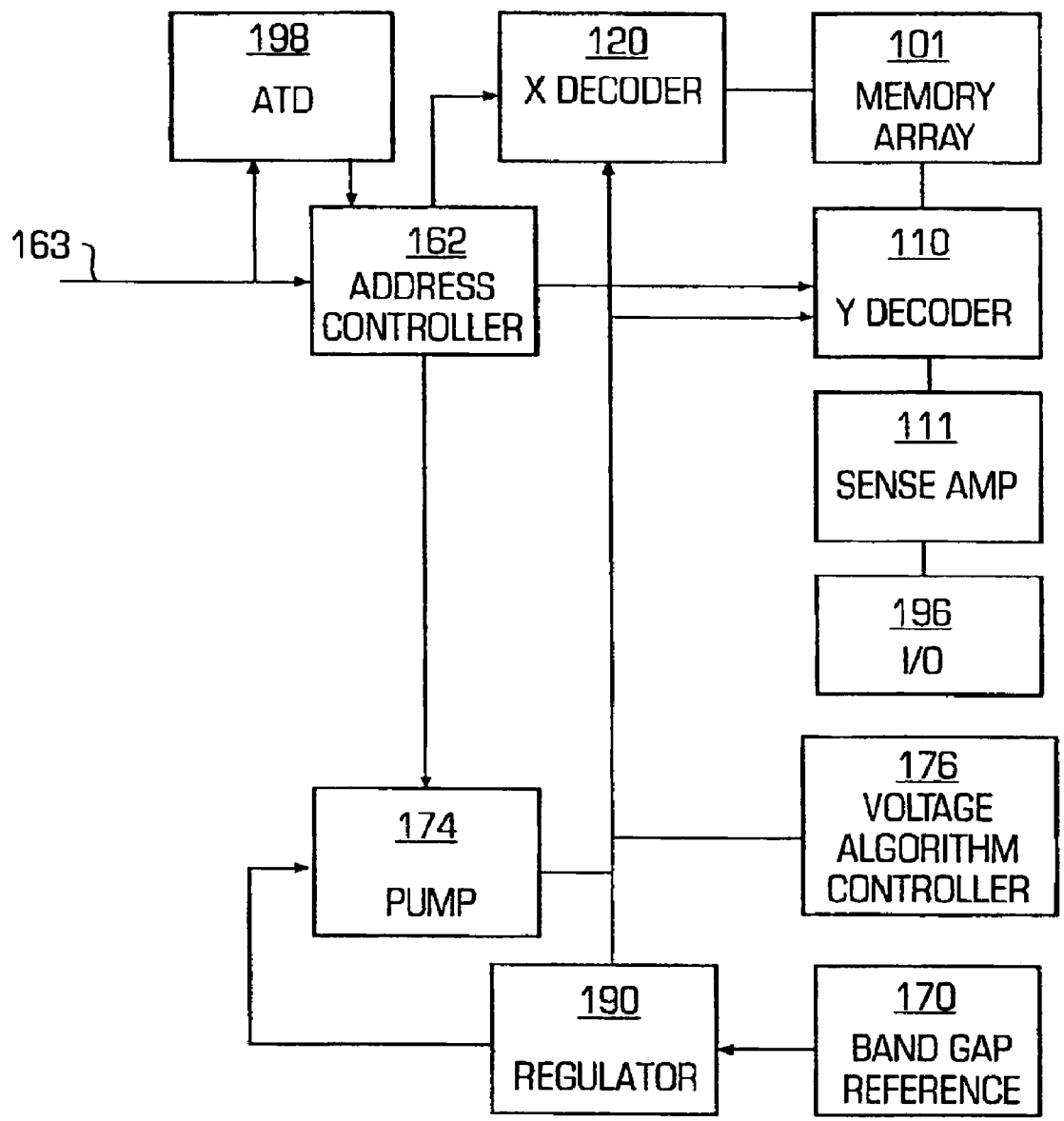
FIG. 1 is a block diagram illustrating a digital multilevel memory system.

FIG. 1 is a block diagram illustrating a digital multilevel bit memory array system 100.

The digital multilevel bit memory array system 100 includes a memory array 101 that includes a plurality of memory cells (not shown). An N-bit digital multilevel cell is defined as a memory cell capable of storing the $2^N$ levels. The memory array 101 may include reference memory cells for storing reference voltage values for multilevel memory cell operation and verification. In another embodiment, the reference memory cells are stored in a separate reference memory array.

In one embodiment, the memory array 101 includes a source side injection flash technology, which uses lower power in hot electron programming, and efficient injector based Fowler-Nordheim tunneling erasure. The programming may be done by applying a high voltage on the source of the memory cell, a bias voltage on the control gate of the memory cell, and a bias current on the drain of the memory cell. The programming in effect places electrons on the floating gate of memory cell. The erase is done by applying a high voltage on the control gate of the memory cell and a low voltage on the source and/or drain of the memory cell. The erase in effect removes electrons from the floating gate of memory cell. The verify (sensing or reading) is done by placing the memory cell in a voltage mode sensing, e.g., a bias voltage on the source, a bias voltage on the gate, a bias current coupled from the drain (bitline) to a low bias voltage such as ground, and the voltage on the drain is the readout cell voltage VCELL. The bias current may be independent of the data stored in the memory cell. In another embodiment, the verify (sensing or reading) is done by placing the memory cell in a current mode sensing, e.g., a low voltage on the source, a bias voltage on the gate, a load (resistor or transistor) coupled to the drain (bitline) from a high voltage supply, and the voltage on the load is the readout voltage. In one embodiment, the array architecture and operating methods may be the ones disclosed in U.S. Pat. No. 6,282,145, entitled "Array Architecture and Operating Methods for Digital Multilevel Nonvolatile Memory Integrated Circuit System" by Tran et al., the subject matter of which is incorporated herein by reference.

The multilevel memory cells of the memory array 101 may be arranged in various ways, such as in rows and columns or in segments. Various addressing schemes may be used which organize the memory cells into bytes, pages or other arrangements.

The digital multilevel bit memory array system 100 further includes an x decoder 120, a y decoder 110, an address controller 162, a sense amplifier circuit 111, and an input/output interface 196. The y decoder 110 controls bitlines (not shown) coupled to columns in memory cells, during a write, read, and array operations. The sense amplifier 111 senses the read data which is provided to the I/O interface 196. The I/O interface 196 also buffers input into the memory array system 100.

In response to an address signal 163 and other control signals (not shown), the address controller 162 decodes the address 163 and controls page, byte, segment or other addressing for the x decoder 120 and the y decoder 110.

The x decoder 120 selects a row or a block of rows in the array 101 based on the signals from the address controller 162 and provides precise multilevel bias values over temperature, process, and power supply used for consistent single level or multilevel memory operation for the memory array 101.

The digital multilevel bit memory array system 100 further includes a band gap voltage generator 170, a charge pump 174, a voltage algorithm controller 176, a voltage supply and regulator 190, and an address transition detector 198 . . . . The voltage algorithm controller 176 provides various specifically shaped voltage signals of amplitude and duration used for multilevel nonvolatile operation and to provide precise voltage values with tight tolerance, used for precision multilevel programming, erasing, and sensing. The band gap voltage generator 170 provides a precise voltage bias value over process, temperature, and supply for multilevel programming, erasing, and sensing. The charge pump 174 is used to provide a voltage supply for multilevel programming, erasing, and sensing. The charge pump 174 may include a dithering pumping clock or a spread spectrum pumping clock. The voltage supply and regulator 190 provides regulated voltage values above or below the external power supply used for erase, program, read, and production tests. The address transition detector 198 provides a signal to the address controller 162 in response to a transition of the address provided to the x decoder 120 or the y decoder 110. The address controller 162 may control the charge pump 174 to time the pumping based on an address transition.

The system 100 may execute various operations on the memory array 101. An erase operation may be done to erase all selected multilevel cells by removing the charge on selected memory cells according to the operating requirements of the non-volatile memory technology used. A data load operation may be used to load in a plurality of bytes of data to be programmed into the memory cells, e.g., 0 to 512 bytes in a page. A read operation may be done to read out in parallel a plurality of bytes of data if the data (digital bits), e.g., 512 bytes within a page, stored in the multilevel cells. A program operation may be done to store in parallel a plurality of bytes of data in (digital bits) into the multilevel cells by placing an appropriate charge on selected multilevel cells depending on the operating requirements of the non-volatile memory technology used. The operations on the memory may be, for example, the operations described in U.S. Pat. No. 6,282,145, incorporated herein by reference above.

Figure 2:
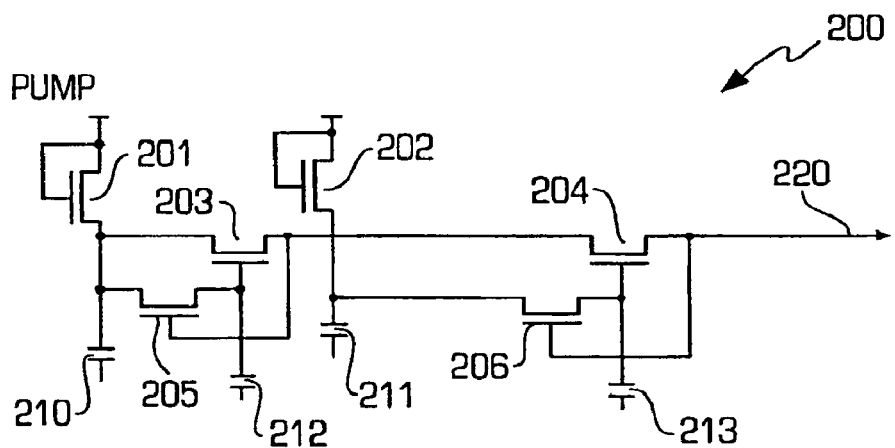
FIG. 2 is a schematic diagram illustrating a conventional charge pump.

FIG. 2 is a schematic diagram illustrating a conventional charge pump 200.

The conventional charge pump 200 may be used in some instances as the charge pump 174 (FIG. 1). The conventional charge pump 200 comprises a plurality of NMOS transistors 201 through 206 and a plurality of capacitors 210 through 213. The terminals of the plurality of capacitors 210-213 may be coupled to the controller 176 (FIG. 1) for charge pumping within the conventional charge pump 200. The conventional charge pump 200 provides a high voltage on a node 220 to the high voltage regulator 190. The conventional charge pump 200 is always on with a typical standby current ISB approximately in the range of 5 to 20 micro amps. During an active period, the conventional charge pump 200 is enabled to shift the voltage. The voltage of the conventional charge pump 200 typically has a rise time that is at least greater than 100 nanoseconds, and is typically a few hundred nanoseconds.

Figure 3:
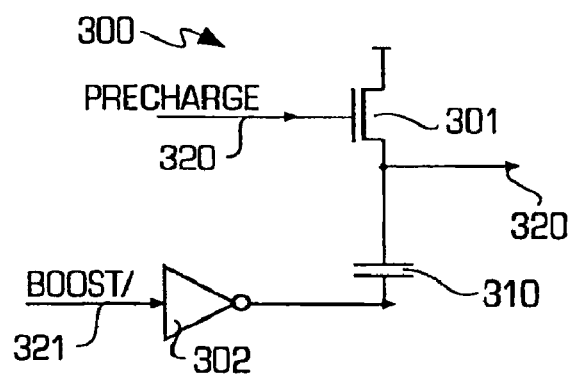
FIG. 3 is a schematic diagram illustrating a boost circuit for a charge pump of FIG. 1.

FIG. 3 is a schematic diagram illustrating a boost circuit 300 for the charge pump 174.

The boost circuit 300 boosts the voltage on the voltage node 320 of the conventional charge pump 200 (FIG. 2). The boost circuit 300 comprises an NMOS transistor 301, an inverter 302 and a capacitor 310. In response to a pre-charge signal 320 applied to a gate, the NMOS transistor 301 pre-charges a voltage node 320 up to the supply voltage minus a NMOS (VT) threshold voltage. The pre-charge signal 320 is disabled and a boost signal 321 is applied to the input of the inverter 302 to boost the voltage on one terminal of the capacitor 310 to thereby boost the voltage on the other terminal of the capacitor 310 which is coupled to the voltage node 320 to thereby boost the voltage on the voltage node 320. Although the conventional boost circuit 300 provides boosting on demand, the boost is dependent on the supply voltage VDD, and typically consumes a high current IDD.

The charge pump 174 may be one of the charge pumps described below in conjunction with FIGS. 4-6.

Figure 4:
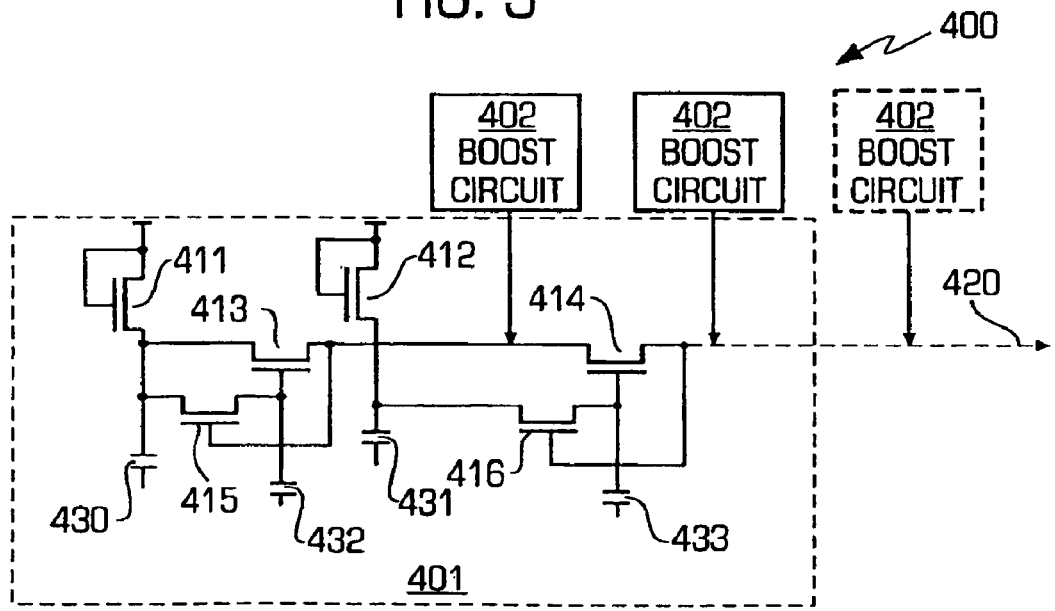
FIG. 4 is a schematic diagram illustrating a fast start charge pump of the digital multilevel memory system of FIG. 1.

FIG. 4 is a schematic diagram illustrating a low power fast start charge pump 400.

The fast start charge pump 400 comprises a pump circuit 401 and a plurality of boost circuits 402. The charge pump 400 provides a voltage that is greater than the supply voltage on a voltage node 420. The pump circuit 401 comprises a plurality of NMOS transistors 411 through 416 and a plurality of capacitors 430 through 433. In one embodiment, the pump circuit 401 is similar to the conventional charge pump 200. The pump circuit 401 provides the increased high voltage with boosting from the plurality of boost circuits 402. One boost circuit 402 is coupled to the drain of the NMOS transistor 414. Other boost circuits 402 are coupled to the source of the NMOS transistor 414. Although three boost circuits 402 are shown in FIG. 4, other numbers of boost circuits may be used progressively along the pump chain. The boost circuits 402 are used to quickly pump up the voltage on the node 420 in a short time period. The pump circuit 401 is then controlled to generate and/or maintain the high voltage on the node 420. The boost circuits 402 may successively boost the voltage on the node 420. The pump circuit 401 provides greater power efficiency and controls the switching loss from decoding or load switching. In an illustrative example, the initial current IDD from the boost is large (e.g., ~5-10 ma) but once the voltage is stable and the regular pump 401 takes over, the IDD current average is much less, e.g., ~2-3 ma. The charge pump 400 may use a dithering pumping clock or a spread spectrum pumping clock as described below.

Figure 5:
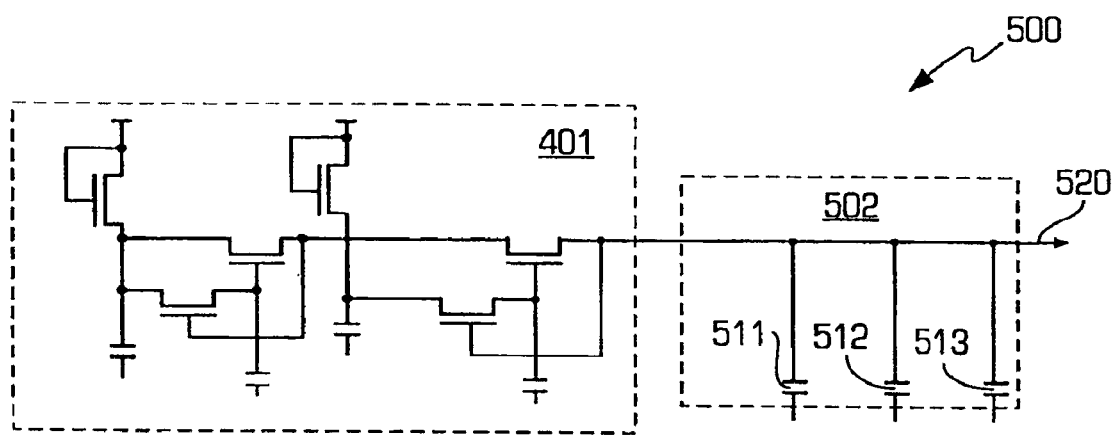
FIG. 5 is a schematic diagram illustrating a fast start charge pump of the fast start charge pump of FIG. 4.

FIG. 5 is a schematic diagram illustrating a fast start charge pump 500.

The fast start charge pump 500 comprises a pump circuit 401 and a boost circuit 502. The boost circuit 502 comprises a plurality of capacitors 511, 512, and 513. The pump circuit 401 applies a high voltage on a voltage node 520. The capacitors 511 through 513 each include a first terminal coupled to the voltage node 520 and each include a second terminal coupled to the voltage algorithm controller 176 that selectively applies a voltage to the second terminal of the corresponding capacitor. The capacitors 511, 512 and 513 may be successively enabled individually to boost the voltage on the voltage node 520. In one embodiment, the capacitance of the capacitor 511 is greater than the capacitance of the capacitor 512, and the capacitance of the capacitor 512 is greater than the capacitance of the capacitor 513. In one embodiment, the loadless successive boosting is done in two nanosecond steps to quickly pump the voltage on the voltage node 520.

In an illustrative embodiment, the capacitors 511, 512 and 513 have a capacitance of 40 picofarads, 20 picofarads, and 10 picofarads, respectively. In this illustrative embodiment, the capacitance of a capacitor load CL (not shown) on the voltage node 520 has a capacitance of 10 picofarads. In an illustrative embodiment, the boost circuit 503 includes the three capacitors 511, 512 and 513. The boost of the voltage is done in three boost stages. During the first boost stage, a voltage is applied to the capacitor 511 to boost the voltage on the node 520 by a ratio of the capacitance of the capacitor 511 to the sum of the capacitance of the capacitors 511, 512, 513 and the load capacitor. In this illustrative example, the ratio is 0.5. At the end of this stage, the capacitor 511 no longer presents a load on the node 520, herein called loadless boosting. During the second boost stage, a voltage is applied to the capacitor 512 to boost the voltage on the node 520 by a ratio of the capacitance of the capacitor 512 to the sum of the capacitances of the capacitors 512, 513 and the load capacitance. At the end of this stage, the capacitor 512 no longer presents a load on the node 520 as a further step in the loadless boosting. In this illustrative example, the ratio is 0.5. During the third boost stage, a voltage is applied to the capacitor 513 to boost the voltage on the node 520 by a ratio of the capacitor 513 to the sum of the capacitances of the capacitor 513 and the load capacitor. In this illustrative example, the ratio is 0.5. At the end of this stage, the capacitor 513 no longer presents a load on the node 520 as a final step (in the illustrative three step example) in the loadless boosting.

Although three capacitors are shown and described for the boost circuit 502, other numbers of capacitors may be used. In one embodiment, the ratio of the boost capacitors to the total loading at each boost time is selected for the maximum boost voltage. At each boost stage, the ratio is the ratio of the capacitor being boosted and the equivalent capacitance of the capacitor being boosted plus the remaining capacitors that are arranged in parallel. Thus, the ratio is the ratio of the capacitor being boosted to the sum of the capacitor being boosted and the remaining capacitors including the load capacitor.

The charge pump 500 may use a dithering pumping clock or a spread spectrum pumping clock as described below.

Figure 6:
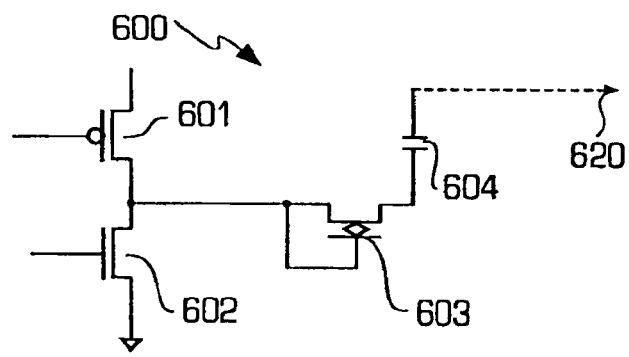
FIG. 6 is a schematic diagram illustrating a boost circuit of the fast start charge pumps of FIGS. 4 and 5.

FIG. 6 is a schematic diagram illustrating a boost circuit 600 for the fast start charge pumps of FIGS. 4 and 5.

The boost circuit 600 comprises a PMOS transistor 601, an NMOS transistor 602, and NLZ NMOS transistor 603, and a capacitor 604. The diode-connected NLZ NMOS transistor 603 and the capacitor 604 are coupled in series between a node 620 and an enable circuit formed of the PMOS circuit 601 and the NMOS transistor 602. The enable circuit formed by the transistors 601 and 602 may be boosted by a clock signal. In another embodiment, the NLZ NMOS transistor 603 may include a gate that is not diode connected but is controlled by a pulsed voltage. At the end of the boosting to the node 620, the other side of the capacitor 604 is floating, and hence presents no load on the node 620.

The address transition detector 198 (FIG. 1) provides a signal to the charge pump in response to a transition of the address provided to the x decoder 120 or the y decoder 110. The charge pump 174 may use the address transition detection (ATD) to generate successive boost enabling of the boost circuits 502 (FIG. 5). In one embodiment, a skew or glitch filtering is done as follows: the address transition detection of the last address switching overrides an earlier address transition detection if the transition between successive address switching is less than a predetermined timing. In one embodiment, the boost enabling of the boost circuit 502 is done after the x decoder 120 has switched. In one embodiment, the boost enabling of the boost circuit 502 is done after the y decoder 110 has switched. This may reduce losses such as from crow bar current or incomplete power transfer loss.

Figure 7:
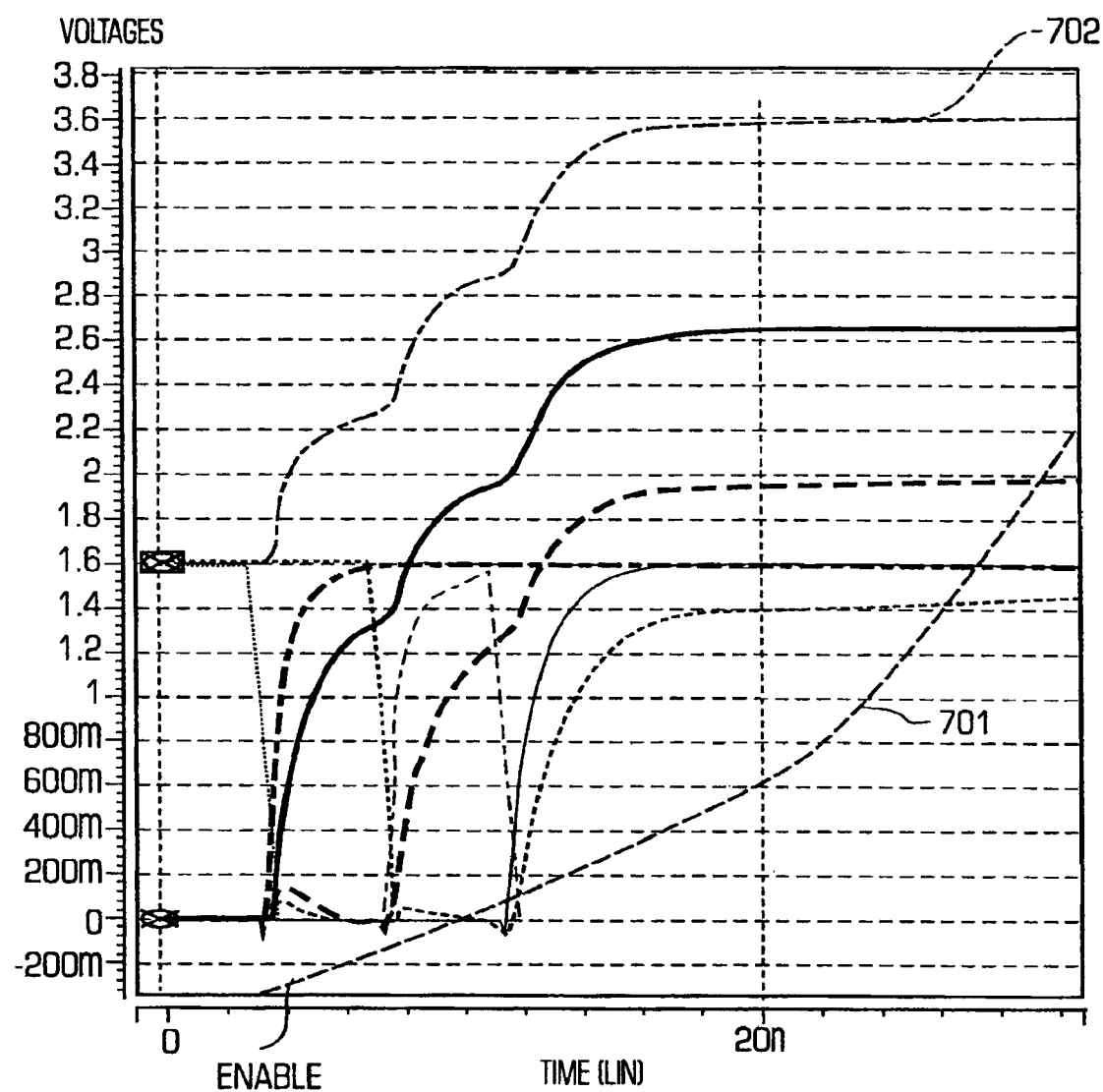
FIG. 7 is a graph illustrating charge pump voltages with and without boosting for the fast start charge pump of FIG. 5.

FIG. 7 is a graph illustrating charge pump voltages with and without boosting.

A line 701 illustrates the pump voltage without boosting. A line 702 illustrates the pump voltage with complete boosting by the charge pump 500. A three stage successive boosting is shown. As shown, the output voltage of the fast pump reaches a stable level within 10 nanoseconds.

The operation of the voltage or pump regulation is next described.

Figure 8:
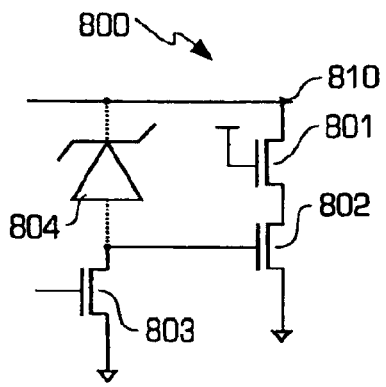
FIG. 8 is a schematic diagram illustrating a conventional zener based regulator.

FIG. 8 is a schematic diagram illustrating a conventional zener based regulator 800.

The conventional zener based regulator 800 provides high voltage shunt regulation. The conventional zener based regulator 800 comprises a plurality of NMOS transistors 801, 802 and 803, and a zener diode 804. The NMOS transistors 801 and 802 form a shunt for the voltage on a node 810 in response to the voltage across the zener 804. In the regulator 800, the accuracy of the regulation heavily depends on the zener diode 804. The shunt regulation consumes the wasted pump current that is not used by the load.

Figure 9:
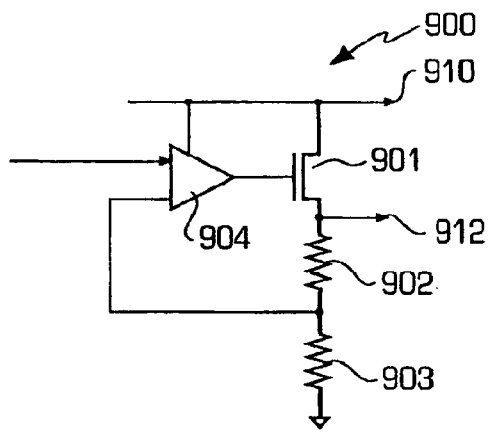
FIG. 9 is a schematic diagram illustrating a conventional operational amplifier based regulator.

FIG. 9 is a schematic diagram illustrating a conventional operational amplifier based regulator 900.

The conventional operational amplifier based regulator 900 provides a voltage series closed loop regulation. The conventional operational amplifier-based regulator 900 comprises a NMOS transistor 901, a plurality of resistors 902 and 903 and a high voltage operational amplifier (op amp) 904. The voltage from a charge pump (such as charge pump 200) is applied on a node 910, which is coupled to the NMOS transistor 901 and the series connected resistors 902 and 903.

The resistors 902 and 903 form a voltage divider to provide a feedback voltage to the operational amplifier 904 for controlling the gate of the NMOS transistor 901 to control the voltage on an output node 912 formed of the source of the NMOS transistor 901. The conventional operational amplifier based regulator 900 is slow and requires a band gap reference voltage applied to an input of the operational amplifier 904 as a reference voltage for controlling the loop regulation. The series regulator 900 provides pump current to the load through the NMOS transistor 901 as needed. The series regulator 900 consumes a fixed bias current through the resistors 902 and 903 and the bias current of the operational amplifier 904.

Refer again to FIG. 1. The voltage supply and regulator 190 may be, for example, a pump regulator described below in conjunction with FIGS. 10-17.

Figure 10:
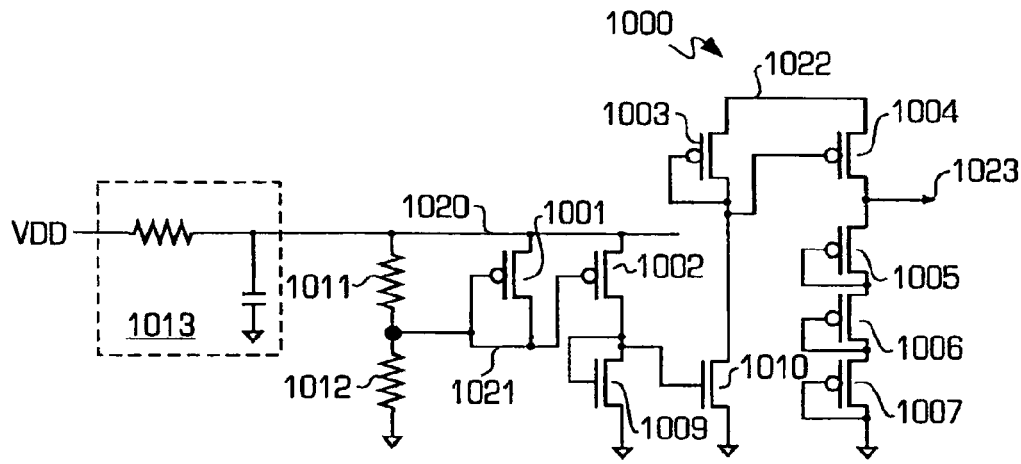
FIG. 10 is a schematic diagram illustrating a first embodiment of a pump regulator of the digital multilevel memory system of FIG. 1.

FIG. 10 is a schematic diagram illustrating a pump regulator 1000.

The pump regulator 1000 provides open loop series regulation for high speed and to minimize power loss relative to regulation such as by shunt regulators. The pump regulator 1000 comprises a plurality of PMOS transistors 1001 through 1007, a plurality of NMOS transistors 1009 and 1010, a plurality of resistors 1011 and 1012, and a filter 1013. For clarity and simplicity, the connections of the wells of the PMOS transistors 1001 through 1007 to their corresponding sources are not shown. The filter 1013 is coupled between a supply voltage VDD node and a voltage node 1020. The filter 1013 may be, for example, a resistor-capacitor filter. In an alternative embodiment, the pump regulator 1000 may not include a filter 1013. The resistors 1011 and 1012 are arranged to form a voltage divider between the voltage node 1020 and ground to form a voltage node 1021 for providing a reference voltage to bias the gates of diode connected PMOS transistor 1001 and the PMOS transistor 1002. The voltage divider sets a voltage across the gate to source of the PMOS transistor 1001. The PMOS transistor 1002 and the NMOS transistor 1009 are arranged to form a current mirror with the transistor 1001. The current through the PMOS transistor 1003 and the NMOS transistor 1010 is mirrored by the PMOS transistor 1004. The diode-connected PMOS transistors 1005, 1006, 1007 form a diode chain to set the voltage (e.g., Vpumpreg) on an output node 1023 in response to the charge pump voltage Vpump applied to a node 1022 on the source of the PMOS transistors 1003 and 1004. The voltage Vpumpreg may be, for example, 3 Volts, and the charge pump voltage Vpump may be, for example, 4-12 Volts.

The PMOS transistor 1001 functions as a reference device relative to the PMOS transistors 1005, 1006 and 1007. In one embodiment, the transistors 1001, 1005, 1006 and 1007 are formed with similar dimensions. As an illustrative example, the voltage across the source to gate of the PMOS transistor 1001 may be one volt and the voltage across the gate to source of each of the PMOS transistors 1005, 1006, and 1007 is one Volt to thereby set the pump regulator voltage on the node 1023 at 3 Volts. Although three diode connected transistors 1005, 1006, 1007 are shown, other numbers of diode connected PMOS transistors may be coupled in series between the voltage node 1023 and ground.

Figure 11:
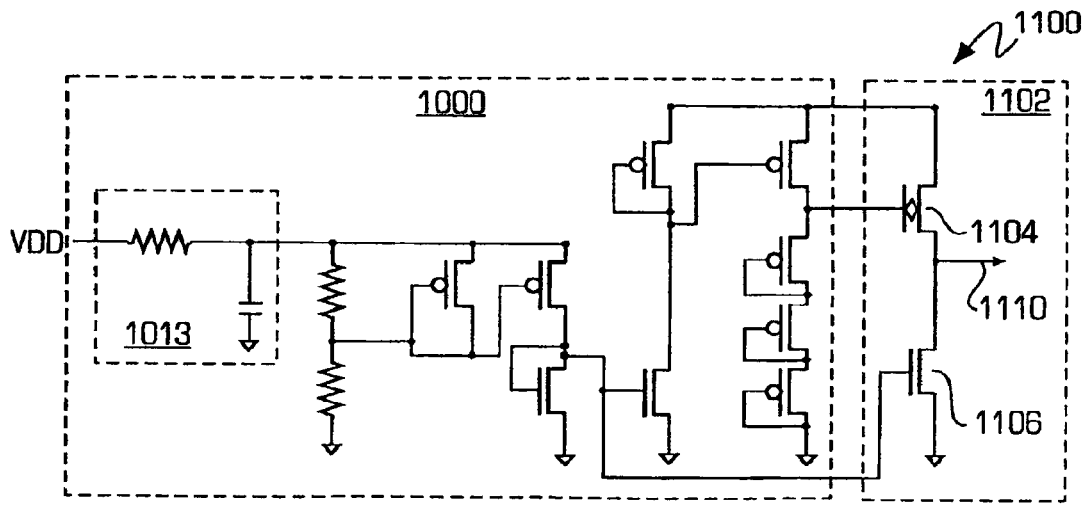
FIG. 11 is a schematic diagram illustrating a second embodiment of a pump regulator of the digital multilevel memory system of FIG. 1.

FIG. 11 is a schematic diagram illustrating a pump regulator 1100.

The pump regulator 1100 comprises a pump regulator 1000 and a first output stage 1102. The first output stage 1102 comprises a NLZ NMOS transistor 1104 and a NMOS transistor 1106 to provide an output voltage on a node 1110. The current mirror formed of the transistors 1002 and 1009 bias the NMOS transistor 1106. The output of the pump regulator 1000 biases the NLZ NMOS transistor 1104 which is arranged as a source follower, which may drive a large capacitive load.

Figure 12:
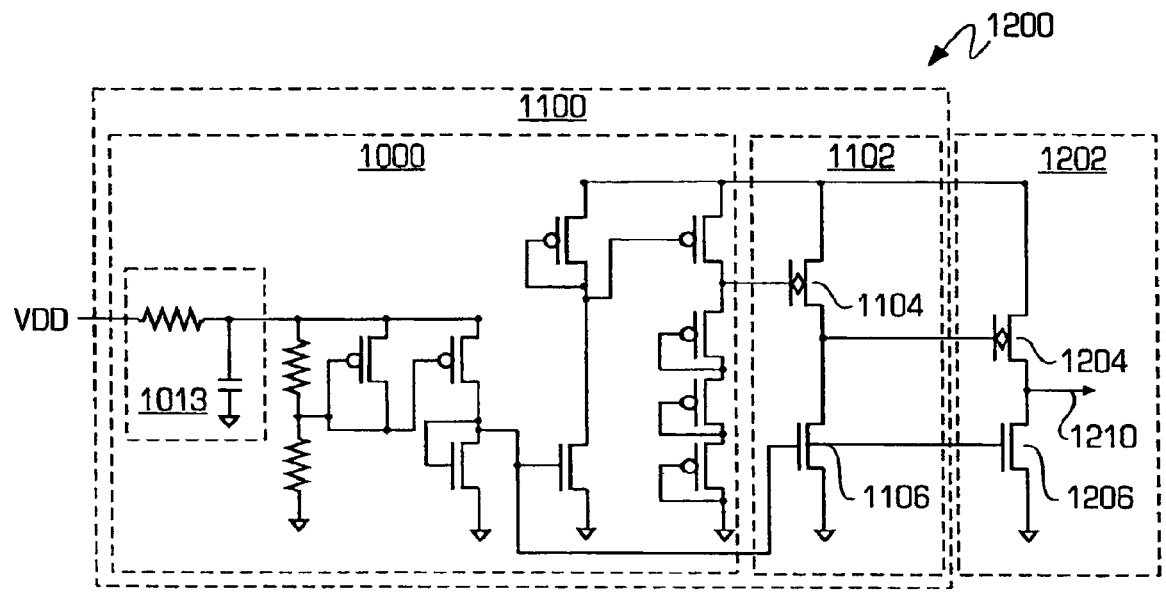
FIG. 12 is a schematic diagram illustrating a third embodiment of a pump regulator of the digital multilevel memory system of FIG. 1.

FIG. 12 is a schematic diagram illustrating a pump regulator 1200.

The pump regulator comprises a pump regulator 1100 and a second output stage 1202. The second output stage 1202 comprises a NLZ NMOS transistor 1204 and an NMOS transistor 1206 coupled in series between the supply voltage and the ground. The source of the NMOS transistor 1204 and the drain of the NMOS transistor 1206 provide an output voltage on the node 1210. The output of the first output stage 1102 biases the gate of the NMOS transistor 1204. The gate of the NMOS transistor 1206 is biased by the transistor 1009. The NMOS transistor 1204 is arranged as a source follower buffer.

Figure 13:
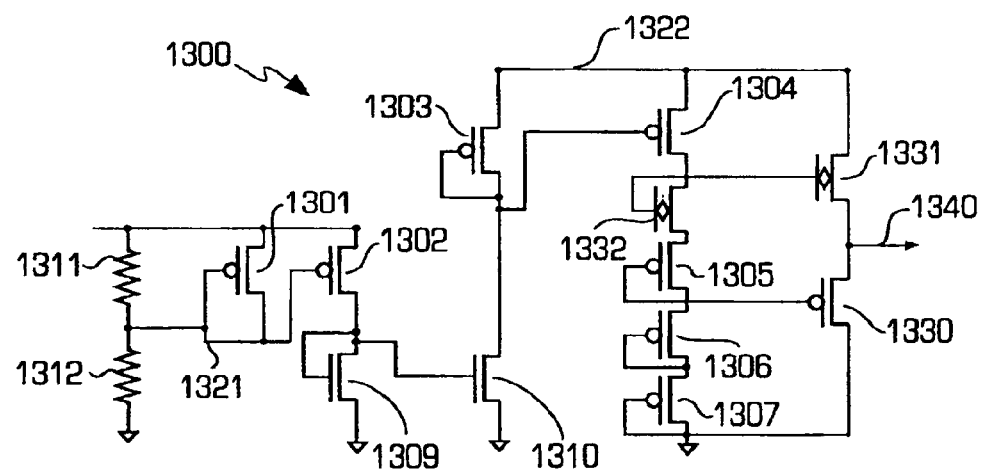
FIG. 13 is a schematic diagram illustrating a fourth embodiment of a pump regulator of the digital multilevel memory system of FIG. 1.

FIG. 13 is a schematic diagram illustrating a pump regulator 1300.

The voltage regulator 1300 comprises a plurality of PMOS transistors 1301-1307 and 1330, a plurality of NMOS transistors 1309, 1310, 1331, and 1332, and a plurality of resistors 1311 and 1312. The transistors 1301, 1302, 1303, 1309 and 1310 and the plurality of resistors 1311 and 1312 are arranged in a similar manner as the transistors 1001, 1002, 1003, 1009, 1010 and the resistors 1011 and 1012, respectively, of the voltage regulator 1000 (FIG. 10). The PMOS transistor 1304, the diode connected NMOS transistor 1332, and the diode connected PMOS transistors 1305, 1306, 1307 are coupled between a node 1322 (which is coupled to the charge pump) and ground so that the current through the PMOS transistor 1304 mirrors the current of the PMOS transistor 1303. The NMOS transistor 1331 and the PMOS transistor 1330 are arranged as an output stage as a push pull source follower to drive large capacitive loads in either direction and form an output terminal 1340.

Figure 14:
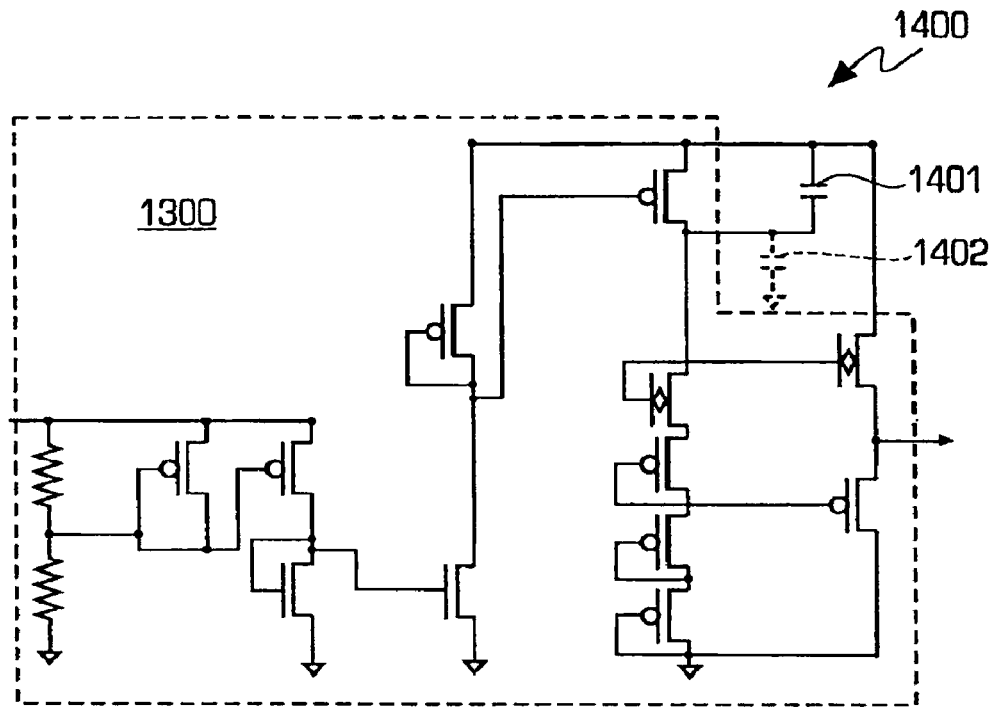
FIG. 14 is a schematic diagram illustrating a fifth embodiment of a pump regulator of the digital multilevel memory system of FIG. 1.

FIG. 14 is a schematic diagram illustrating a pump regulator 1400.

The pump regulator 1400 comprises a pump regulator 1300 and a capacitor 1401. In another embodiment, the pump regulator 1400 further comprises a capacitor 1402. The capacitors 1401 and 1402 speed up AC regulation by arranging the ratio of the capacitors to set the output voltage at the regulated voltage.

Figure 15:
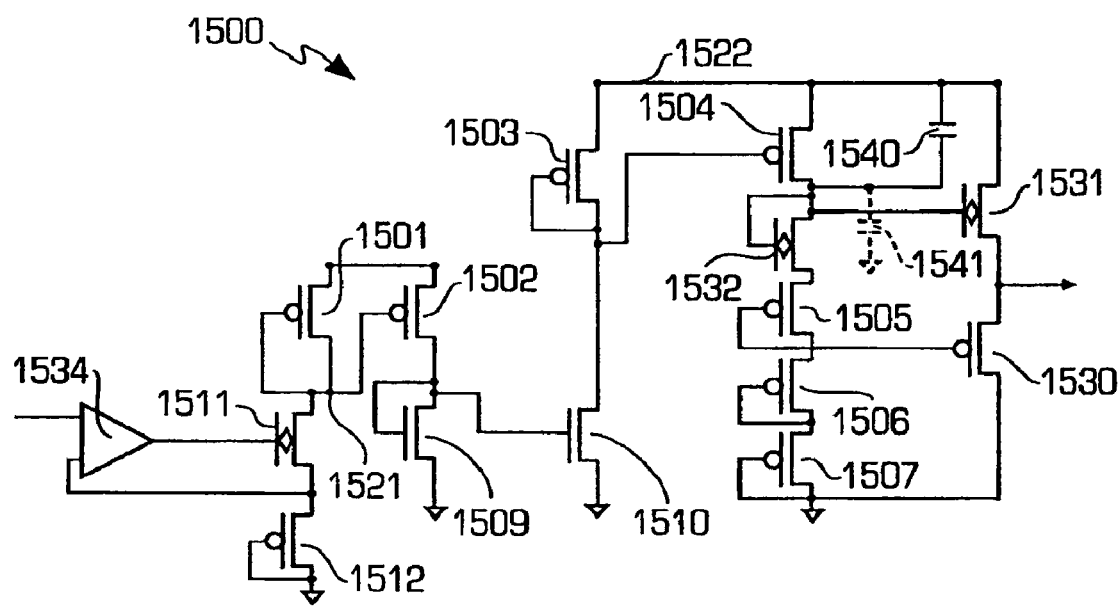
FIG. 15 is a schematic diagram illustrating a sixth embodiment of a pump regulator of the digital multilevel memory system of FIG. 1.

FIG. 15 is a schematic diagram illustrating a pump regulator 1500.

The pump regulator 1500 comprises a plurality of PMOS transistors 1501-1507 and 1530, a plurality of NMOS transistors 1509, 1510, 1531, 1532 that are arranged in a similar manner as the PMOS transistors 1301-1307 and 1330, respectively, and NMOS transistors 1309, 1310, 1331, and 1332, respectively, of the pump regulator 1300 (FIGS. 13 and 14). The pump regulator 1500 further comprises a plurality of capacitors 1540 and 1541 that are arranged in a similar manner as the capacitors 1401 and 1402, respectively, of the pump regulator 1400 (FIG. 14). The pump regulator 1500 further comprises an operational amplifier 1534 including an input coupled to receive a supply voltage or a reference voltage (such as from the band gap). The pump regulator 1500 further comprises a NMOS transistor 1511 and a diode connected PMOS transistor 1512 coupled between a voltage node 1521 formed of the drain of the PMOS transistor 1501, and ground. The gate of the NMOS transistor 1511 is biased by the output of the operational amplifier 1534, which receives negative feedback from the source of the NMOS transistor 1511. A voltage node 1522 is coupled to a charge pump.

In one embodiment, the loop of the operational amplifier 1534 is always enabled for speed. A pump connected to the regulator 1500 may then have a small standby current ISB.

In another embodiment, the gate of the transistor 1504 is connected directly to the gate and source of the PMOS transistor 1501, and the source of the PMOS transistor 1501 is connected directly to the node 1522.

In an alternative embodiment, the PMOS transistor 1512 is replaced by a resistor, and the PMOS transistors 1505, 1506 and 1507 are replaced by another resistor.

Figure 16:
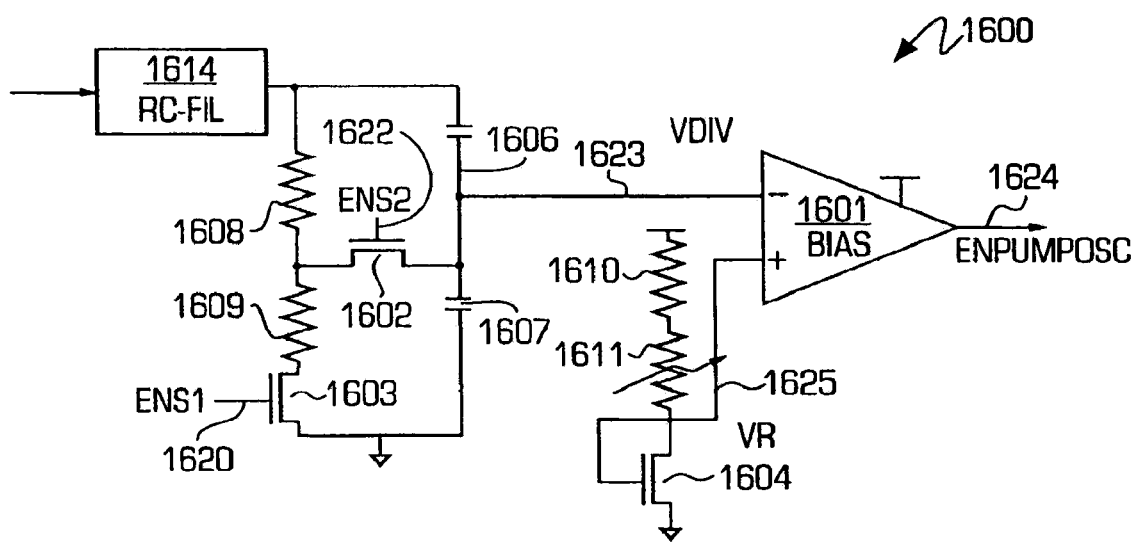
FIG. 16 is a schematic diagram illustrating a seventh embodiment of a pump regulator of the digital multilevel memory system of FIG. 1.

FIG. 16 is a schematic diagram illustrating a pump regulator 1600.

The pump regulator 1600 is a series regulator comparing a ratio of a divided voltage output against a stable voltage reference to enable or disable the charge pump by enabling or disabling a pump clock. The pump regulator 1600 comprises the plurality of NMOS transistor 1602, 1603, and 1604, a plurality of capacitors 1606 and 1607, a plurality of resistors 1608, 1609, 1610, and 1611, a filter 1614, and an operational amplifier 1601. The filter 1614 is coupled between a pump voltage and the resistor 1608 and the capacitor 1606. The filter 1614 may be, for example, a resistor capacitor filter. In an alternative embodiment, the pump regulator 1600 does not include the filter 1614. The capacitors 1606 and 1607 are arranged as a capacitor divider to divide the voltage from the filter 1614 and provide a divided voltage on a node 1623 coupled to the operational amplifier 1601 for comparison to the reference voltage on a node 1625 coupled to the operational amplifier 1601. The ratio of the capacitance of the capacitors 1606 and 1607 is used to avoid current consumption. The reference voltage on the node 1625 is set by a sized resistance formed of the resistor 1610 and 1611 into a sized NMOS transistor 1604 to provide a zero temperature coefficient voltage on the node 1625. The resistors 1608 and 1609 are ratio-ed corresponding to the capacitors 1606 and 1607 and are sampled into the divided voltage on the node 1623 in parallel with the capacitors 1606 and 1607 to restore the divided voltage on the node 1623 against leakage. The sampling of the resistors 1608 and 1609 is controlled by the NMOS transistors 1602 and 1603 in response to enable signals 1622 and 1620, respectively. The ratios of the capacitors of 1606 and 1607 and the ratio of the resistors 1608 and 1609 are adjustable to provide an output voltage adjustment. The resistance of the resistors 1610 and 1611 may also be adjusted to provide zero temperature coefficient reference and/or output adjustment. The operational amplifier 1601 provides on a node 1624 an enable pump oscillator signal to disable or enable an oscillator in the charge pump 174 (FIG. 1) in response to the divided voltage on the node 1623 and the reference voltage on the node 1625. The operational amplifier may be biased from the same reference voltage on the node 1625. The resistors 1610, 1611 and the operational amplifier 1601 may be biased by a small current in a standby mode and a large current in an active mode to minimize power consumption in the standby mode and maximize response time in the active mode.

Figure 17:
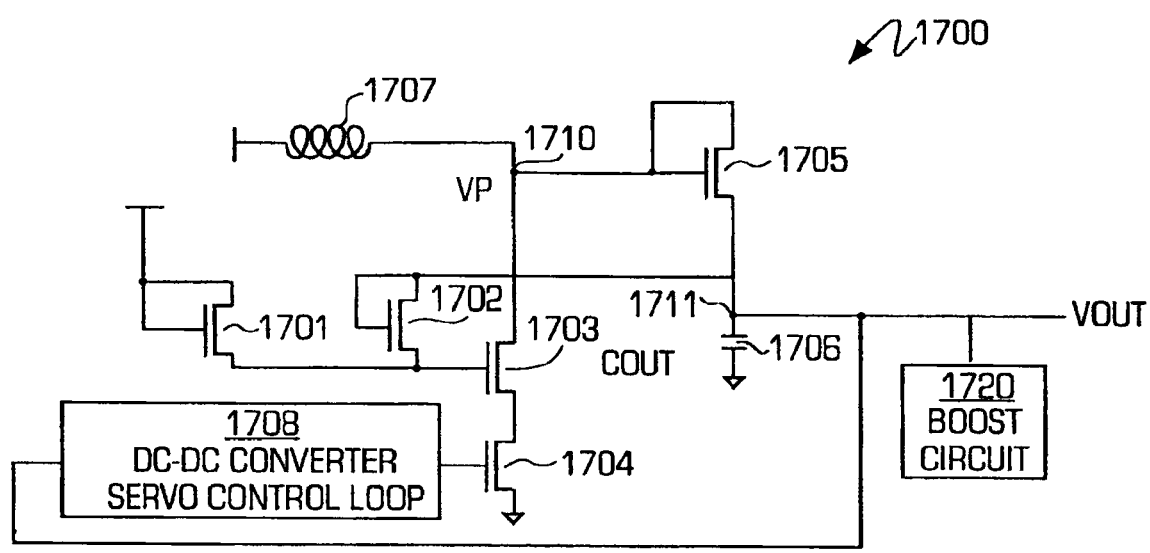
FIG. 17 is a schematic diagram illustrating an eighth embodiment of a pump regulator of the digital multilevel memory system of FIG. 1.

FIG. 17 is a schematic diagram illustrating a pump plus regulator 1700.

The voltage regulator 1700 comprises a plurality of NMOS transistors 1701 through 1705, a capacitor 1706, and an inductor 1707, a DC-DC converter servo control loop circuit 1708, and a boost circuit 1720. The boost circuit 1720 is optionally used to quickly boost the output voltage on an output node (VOUT) 1711. The boost circuit 1720 may be similar to the boost circuit 402 (FIG. 4). The NMOS transistor 1704 is turned on to pull a voltage node 1710 to zero so that the inductor 1707 (e.g., 10-200 nH) stores energy. The NMOS transistor 1704 is then turned off so that the energy stored in the inductor 1707 is transferred to the output capacitor 1706 (e.g., 20 pF-100 nF) through the diode connected NMOS transistor 1705. The capacitor 1706 may be used to boost the output node 1711 quickly by precharging its positive terminal (the output node 1711) to VDD or VDD-VT, and then driving its negative terminal (instead of connecting to ground) to VDD. The NMOS transistor 1703 is used to buffer the breakdown from the pump voltage on the node 1710. The NMOS transistor 1701 precharges the gate of the NMOS transistor 1703. The NMOS transistor 1702 is used to charge back the pumped output into the gate of the NMOS transistor 1703. The servo control loop circuit 1708 controls the output voltage on an output node 1711 and holds it at a constant voltage through pulse width modulation or frequency modulation. The control loop circuit 1708 provides a clock (F-clk) to modulate the gate of the NMOS transistor 1704, which may be modulated by spread spectrum or dithering as described below to reduce electromagnetic interference.

In another embodiment for FIGS. 10-14, the band gap 170 may provide a reference voltage instead of a power supply VDD.

In another embodiment, a time-out is used to shut down the pump oscillator only after a certain time after chip disabling (e.g., 500 ns) to minimize power. In one embodiment, the output of the charge pumps is floating (with no discharge) in standby.

In one embodiment a method is used to reduce the noise from an on-chip charge pumping as following. The charge pump oscillator is modulated by dithering the frequency such as by a random number generator to spread out the noise over wide band of frequencies. This can be done for example by modulating the bias current of the current controlled oscillator or modulating the bias voltage of a voltage controlled oscillator by injecting a bias amount generated by a random number generator into the oscillator bias. In another embodiment, the charge pump oscillator can be modulated in frequency to vary says from 1-5% in frequency over a cyclic period which is a multiple of the charge pump oscillator. The amount of the variation can be implemented in a triangular shape. This technique is to be called dithered charge pump generation or spread spectrum charge pumping.

In another embodiment, another pump is coupled in parallel to the fast start pump. In standby, this pump is enabled to be on when the pump output falls below a sufficient high voltage for read and off otherwise. The fast start pump kicks in when the read operation is enabled such as by a chip enable pin CE/going low. In this case, there is small stand-by current (e.g., <10 µa) due to the additional pump to provide for leakage current and any regulation circuit current.

In the foregoing description, various methods and apparatus, and specific embodiments are described. However, it should be obvious to one conversant in the art, various alternatives, modifications, and changes may be possible without departing from the spirit and the scope of the invention which is defined by the metes and bounds of the appended claims.

What is claimed is:

1. A voltage regulator comprising:
   first, second, third, fourth, and fifth transistors, each transistor including first and second terminals spaced apart with a channel therebetween and including a gate for controlling current in said channel, said gate and first terminal of the first transistor being coupled to a first voltage terminal, said second terminal of the first transistor being coupled to the second terminal of the second transistor and the gate of the third transistor, and said gate and said first terminal of the fifth transistor being coupled to the first terminal of the third transistor, such that the second transistor is configured to charge back a pumped output into said gate of the third transistor;

wherein said second terminal of the third transistor being coupled to the first terminal of the fourth transistor, and said second terminal of the fourth transistor being coupled to a ground terminal, such that the third transistor and the fourth transistor are connected in series between the output terminal and ground;

an inductor including a first terminal coupled to a second voltage terminal and including a second terminal coupled to the first terminal of the third transistor and coupled to the gate and first terminal of the fifth transistor;

a capacitor including a first terminal coupled to the gate and first terminal of the second transistor, to the second terminal of the fifth transistor and to the output terminal; and a control circuit including an input coupled to the output terminal and including an output coupled to the gate of the fourth transistor.

2. The voltage regulator of claim 1 further comprising a boost circuit coupled to the output terminal.

3. The voltage regulator of claim 1 further comprising a capacitor divider coupled to the output terminal to regulate said output voltage.

4. The voltage regulator of claim 3 wherein ratio of capacitance values of capacitors in the capacitance divider are set to avoid current consumption.

5. The voltage regulator of claim 1 wherein a push-pull source follower stage is connected to the output terminal.

6. The voltage regulator of claim 1 wherein the output is provided as a function of a ratio of a divided voltage controlled by the voltage regulator compared against a stable voltage.

7. The voltage regulator of claim 1 wherein the capacitor includes a second terminal coupled to a ground terminal.

8. The voltage regulator of claim 7 further comprising a boost circuit coupled to the output terminal.

9. The voltage regulator of claim 7 further comprising a capacitor divider coupled to the output terminal to regulate said output voltage.

10. The voltage regulator of claim 9 wherein ratio of capacitance values of capacitors in the capacitance divider are set to avoid current consumption.

11. The voltage regulator of claim 7 wherein a push-pull source follower stage is connected to the output terminal.

12. The voltage regulator of claim 7 wherein the output is provided as a function of a ratio of a divided voltage controlled by the voltage regulator compared against a stable voltage.

13. A voltage regulator comprising:

first, second, third, fourth, and fifth transistors, each transistor including first and second terminals spaced apart with a channel therebetween and including a gate for controlling current in said channel, said gate and first terminal of the first transistor being coupled to a first voltage terminal, said second terminal of the first transistor being coupled to the second terminal of the second transistor and the gate of the third transistor, said second terminal of the third transistor being coupled to the first terminal of the fourth transistor, said second terminal of the fourth transistor being coupled to a ground terminal;

an inductor including a first terminal coupled to a second voltage terminal and including a second terminal coupled to the first terminal of the third transistor and coupled to the gate and first terminal of the fifth transistor;

a capacitor including a first terminal coupled to the gate and first terminal of the second transistor, to the second terminal of the fifth transistor and to an output terminal; and a control circuit including an input coupled to the output terminal and including an output coupled to the gate of the fourth transistor;

wherein the capacitor includes a second terminal coupled to a negative terminal of the output node, such that the negative terminal may be driven to VDD.

14. The voltage regulator of claim 13 further comprising a boost circuit coupled to the output terminal.

15. The voltage regulator of claim 13 further comprising a capacitor divider coupled to the output terminal to regulate said output voltage.

16. The voltage regulator of claim 15 wherein ratio of capacitance values of capacitors in the capacitance divider are set to avoid current consumption.

17. The voltage regulator of claim 13 wherein a push-pull source follower stage is connected to the output terminal.

18. The voltage regulator of claim 13 wherein the output is provided as a function of a ratio of a divided voltage controlled by the voltage regulator compared against a stable voltage.

19. The voltage regulator of claim 13 wherein the control circuit provides a clock signal to modulate the gate of the fourth transistor.

20. The voltage regulator of claim 19 wherein the control circuit is configured to modulate the clock signal applied to the gate of the fourth transistor via a spread spectrum technique to reduce electromagnetic interference.

21. The voltage regulator of claim 19 wherein the control circuit is configured to modulate frequency of the clock signal applied to the gate of the fourth transistor via a dithering technique to reduce electromagnetic interference.

22. The voltage regulator of claim 13 wherein the capacitor includes a second terminal coupled to a ground terminal.

23. The voltage regulator of claim 22 further comprising a boost circuit coupled to the output terminal.

* * * * *